(12) United States Patent
Boos

(10) Patent No.: US 10,944,541 B2
(45) Date of Patent: Mar. 9, 2021

(54) LO FREQUENCY GENERATION USING RESONATOR

(71) Applicant: Intel Corporation, Santa Clara, CA (US)

(72) Inventor: Zdravko Boos, Munich (DE)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/556,864

(22) Filed: Aug. 30, 2019

(65) Prior Publication Data

US 2019/0394016 A1 Dec. 26, 2019

(51) Int. Cl.
*H03D 1/04* (2006.01)
*H04L 7/033* (2006.01)
*H04B 1/10* (2006.01)
*H04B 1/38* (2015.01)

(52) U.S. Cl.
CPC ......... *H04L 7/0331* (2013.01); *H04B 1/1027* (2013.01); *H04B 1/38* (2013.01)

(58) Field of Classification Search
CPC ........ H04L 7/0331; H04B 1/1077; H04B 1/38
USPC .......................................................... 375/346
See application file for complete search history.

(56) References Cited

U.S. PATENT DOCUMENTS

| | | | | |
|---|---|---|---|---|
| 6,081,164 A * | 6/2000 | Shigemori | ........ | H01L 23/49596 331/16 |
| 6,510,191 B2 * | 1/2003 | Bockelman | ............. | G06F 1/022 327/269 |
| 7,409,416 B2 * | 8/2008 | Stengel | .................... | G06F 1/025 708/270 |
| 7,415,247 B1 * | 8/2008 | Vaisanen | .............. | H04B 1/0057 455/234.1 |
| 7,482,885 B2 * | 1/2009 | Sridharan | ................ | G06F 1/022 331/1 A |
| 8,044,737 B2 * | 10/2011 | Mohanty | ................... | H03B 5/30 331/116 M |
| 8,860,514 B2 * | 10/2014 | Weltin-Wu | ............. | H03K 5/131 331/143 |
| 9,008,252 B2 * | 4/2015 | Mayer | ....................... | H03L 7/00 375/354 |
| 9,979,405 B1 * | 5/2018 | Deng | ....................... | H03L 7/081 |
| 2015/0372644 A1 * | 12/2015 | Boos | ....................... | H04L 27/20 331/46 |

(Continued)

OTHER PUBLICATIONS

Bahr, Bichoy et al. "32GHz Resonant-Fin Transistors in 14nm FinFet Technology." 2018 IEEE International Solid-State Circuits Conference. ISSCC 2018/Session 21/Extending Silicon and Its Applications/21.3. 3 pages.

*Primary Examiner* — Helene E Tayong
(74) *Attorney, Agent, or Firm* — 2SPL Patent Attorneys PartG mbB; Yong Beom Hwang

(57) ABSTRACT

Systems, methods, and circuitries are provided for resonator-based local oscillator signal generation for receiving self-interference signals. An interference cancellation system for a transceiver includes a resonator configured to generate a high-frequency signal and a local oscillator circuitry. The local oscillator circuitry includes a digital-to-time converter configured to receive the high-frequency signal and, in response, generate a clock signal for receiving an interfering signal having an interference frequency. Digital cancellation circuitry is configured to adapt operation of the transceiver based, at least in part, on the received interfering signal.

23 Claims, 6 Drawing Sheets

(56) References Cited

U.S. PATENT DOCUMENTS

2016/0226447 A1* 8/2016 Fukuzawa ............... H03B 5/32
2017/0213821 A1* 7/2017 Or-Bach ............. H01L 21/6835
2018/0131502 A1* 5/2018 Askar .................. H04L 5/1461

* cited by examiner

LO FREQUENCY GENERATION USING RESONATOR

BACKGROUND

Interference caused with concurrent transmission and reception is the key problem in multiple radio access technology (RAT) and multi band transceivers. Carrier aggregation in LTE systems and concurrency in highly integrated multi-RATs transceivers is exponentially increasing number of modulated and non-modulated spurs falling in the wanted receiver's band.

DESCRIPTION

Figure 1A:
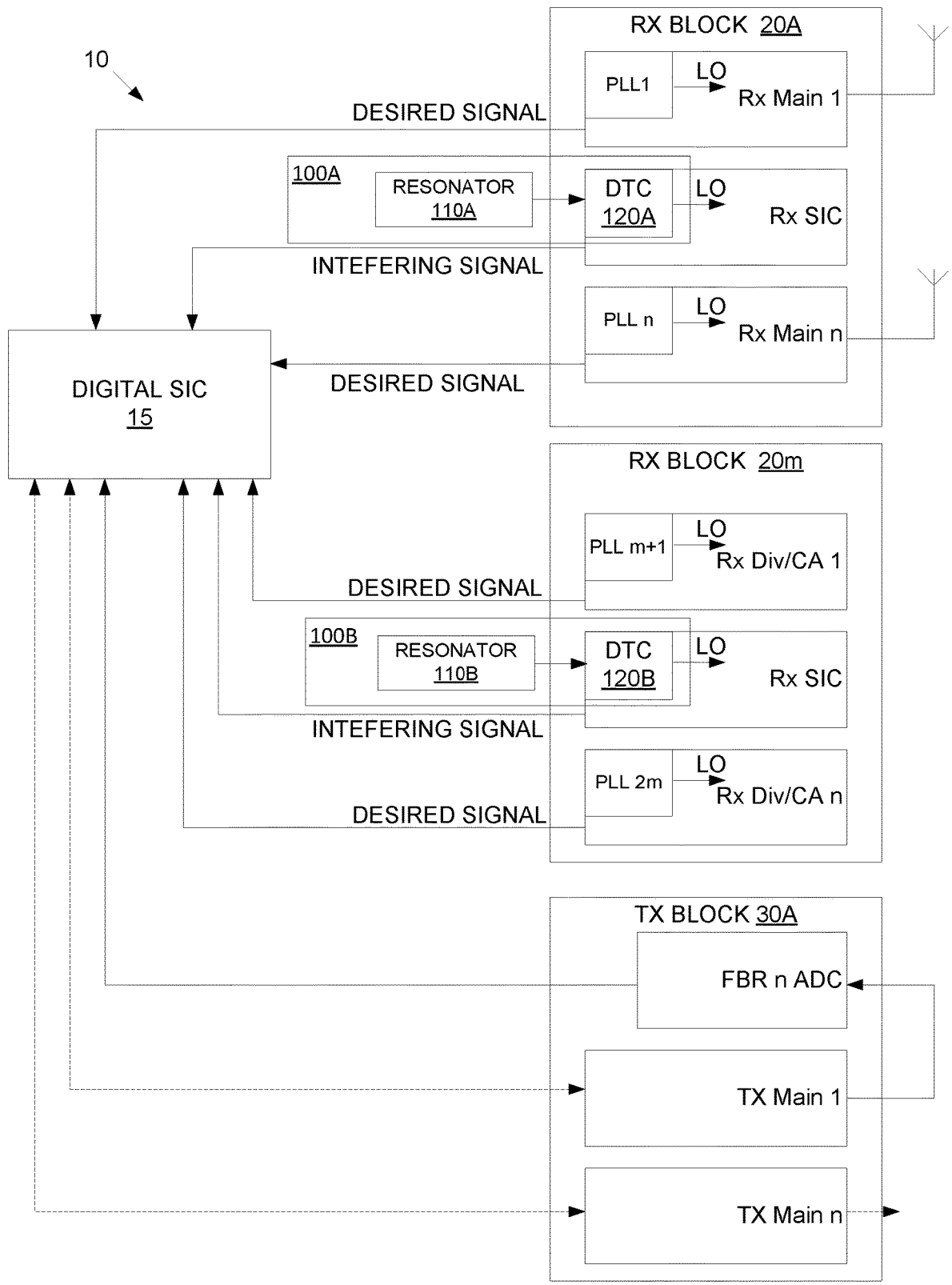
FIG. 1A illustrates an exemplary transceiver that includes an interference cancellation system with resonator-based LO signal generation for receiving interfering signals in accordance with various aspects described.

Self-interference in a transceiver occurs when signals transmitted and/or received by the transceiver in different channels interfere with one another. As transceivers become more complex (e.g., multiple-input multiple-output transceivers and transceivers that perform carrier aggregation or receive diversity) there may be more receiver chains and transmitter chains to generate interfering signals. Self-interference cancellation (SIC) for a receiver is used to mitigate interference in either the digital domain or in a mixed signal domain. Digital SIC is based on modeling the complete transmit chain with a digital filter that is applied to the received signals. While digital SIC has the benefit of using only digital components, the kernel used to generate the digital filter can become quite complex depending on the type of interference being cancelled. This results in high power and area consumption.

In mixed signal SIC interfering signals are measured in the analog domain and interference cancellation is performed in the digital domain. In order to work properly, a mixed signal interference cancellation system should be capable of generating an extended range of LO signals (which are possibly outside the range of operating channels) so that a SIC receiver chain(s) can be tuned to frequencies on which there may be interference. Many LO signal generators include tuning circuits with inductive coils to tune the LO signal frequency. These coils are large, expensive, and tend to interfere with surrounding analog circuitry.

Described herein are methods, circuitries, and systems for resonator-based local oscillator signal generation for mixed signal cancellation systems. Rather than a traditional phase locked loop (PLL) circuit that includes a coil-based tuning circuit, a resonator is used to generate a clock signal for use by a digital-to-time converter in generating the LO signal in the SIC receiver chain.

The present disclosure will now be described with reference to the attached figures, wherein like reference numerals are used to refer to like elements throughout, and wherein the illustrated structures and devices are not necessarily drawn to scale. As utilized herein, terms "module", "component," "system," "circuit," "element," "slice," "circuitry," and the like are intended to refer to a set of one or more electronic components, a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuits can reside within the same circuitry, and circuitry can be localized on one computer and/or distributed between two or more computers. A set of elements or a set of other circuits can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include one or more processors therein to execute executable instructions stored in computer readable storage medium and/or firmware that confer(s), at least in part, the functionality of the electronic components.

It will be understood that when an element is referred to as being "connected" or "coupled" to another element, it can be physically connected or coupled to the other element such that current and/or electromagnetic radiation (e.g., a signal) can flow along a conductive path formed by the elements. Intervening conductive, inductive, or capacitive elements may be present between the element and the other element when the elements are described as being coupled or connected to one another. Further, when coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

As used herein, a signal that is "indicative of" a value or other information may be a digital or analog signal that encodes or otherwise communicates the value or other information in a manner that can be decoded by and/or cause a responsive action in a component receiving the signal. The signal may be stored or buffered in computer readable storage medium prior to its receipt by the receiving component and the receiving component may retrieve the signal from the storage medium. Further, a "value" that is "indicative of" some quantity, state, or parameter may be physically embodied as a digital signal, an analog signal, or stored bits that encode or otherwise communicate the value.

Use of the word example is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

FIG. 1A illustrates an exemplary transceiver 10 that includes m receiver blocks 20A-20m as well as multiple transmitter blocks 30A (only one shown). Each receiver block includes multiple receiver chains, where each chain is configured to isolate and process a signal received in a certain channel or range of frequencies. The different receiver chains may be connected to different antennas or the same antenna. The different receiver blocks may be configured to process signals in different manners, such as, for example, receive diversity or carrier aggregation. During operation of the transceiver 10 selected receiver and/or transmitter blocks are activated depending on the desired transceiver mode. Each receiver block includes one or more receiver chains that are configured to receive and process "desired signals" which are "intended" or "wanted" signals that were transmitted to the receiver. These receiver chains are tuned to a desired signal frequency or operating channel of the receiver.

Some or all of the receiver blocks also include a SIC receiver chain that is configured to be tuned to frequencies that may include interfering signals. Together with digital SIC circuitry 15, the SIC receiver chain(s) make up an interference cancellation system for the transceiver 10. The interfering signals received by the SIC receiver chains are used by a digital cancellation circuitry (digital SIC) to adapt operation of the transceiver to mitigate the effects of the interfering signals. The range of LO signals used to tune the SIC receiver chain to the frequencies can be quite extensive. In some transceivers, PLLs are used in each receive chain, including the SIC receiver chain, to generate the LO signals used for tuning.

The interference cancellation system in the receiver blocks includes a resonator-based LO signal generation system 100A or 100B that generates the LO signal for the SIC receive chain. For the purposes of this description, system 100A will be described, it is noted that system 100B includes analogous components and functions in a similar manner. The resonator-based LO signal generation system 100A includes a resonator 110A (or 110B in system 100B) configured to generate a high-frequency signal and local oscillator circuitry. The local oscillator circuitry in the system 100A includes a digital-to time converter 120A (or 120B in system 100B), configured to be operated in an open loop mode, configured to receive the high-frequency signal and a control word and, in response, generate a clock signal (e.g., an LO signal or a signal used as a clock signal for another component generating the LO signal) having a clock frequency. The clock signal is for use in receiving an interfering signal having an interference frequency (e.g., a LO signal). While in FIG. 1A only the SIC receiver chains include a resonator-base LO signal generation system such as 100A or 100B in other examples other receiver chains may also use a resonator-based LO signal generation system (see FIG. 1B).

Recently developed resonators are capable of generating very high frequency signals that are stable enough to be suitable for use as clock signals for generating LO signals. Resonators are powered by a clean supply voltage to generate clock signals that are much higher than those that can be produced by crystal oscillators. For the purposes of this description, the term "resonator" consists essentially of digital components and is capable of generating very high frequency signals without use of a coil (e.g., for tuning an oscillator circuit). In one example, the frequency of the high frequency signal generated by the resonator is greater than or equal to 10 GHz. In many examples, the high frequency of the signal produced by the resonator will be higher than the interference frequency and/or the frequency of the desired signals. For example, a resonator may include one or more of a bulk acoustic wave resonator, a micro-electromechanical system resonator, a surface acoustic wave resonator, or a film bulk acoustic resonator.

Another type of resonator includes a plurality of transistors having a raised channel from source to drain. The transistors are arranged in rows in which the raised channels are parallel to one another. A crystalline material is deposited between selected raised channels in adjacent rows to form a contact. A single continuous gate is used to bias the transistors in both rows and a driving signal is applied to crystalline contacts. The resonator's output clock signal is generated at the drains of the transistors that are not connected to the crystalline contacts. This type of resonator is capable of generating a clock signal having a frequency ranging from 10 GHz to 30 GHz.

The local oscillator signal generation system 100A of FIG. 1A does not cause new interference (or it is order of magnitude lower than previous solutions). LO signal frequency can be changed about two orders of magnitude faster than a PLL because the digital-to-time converter 120A is an open loop system. Further, the digital-to-time converter 120A does not use an inductor or coil so chip area is significantly reduced.

Figure 1B:
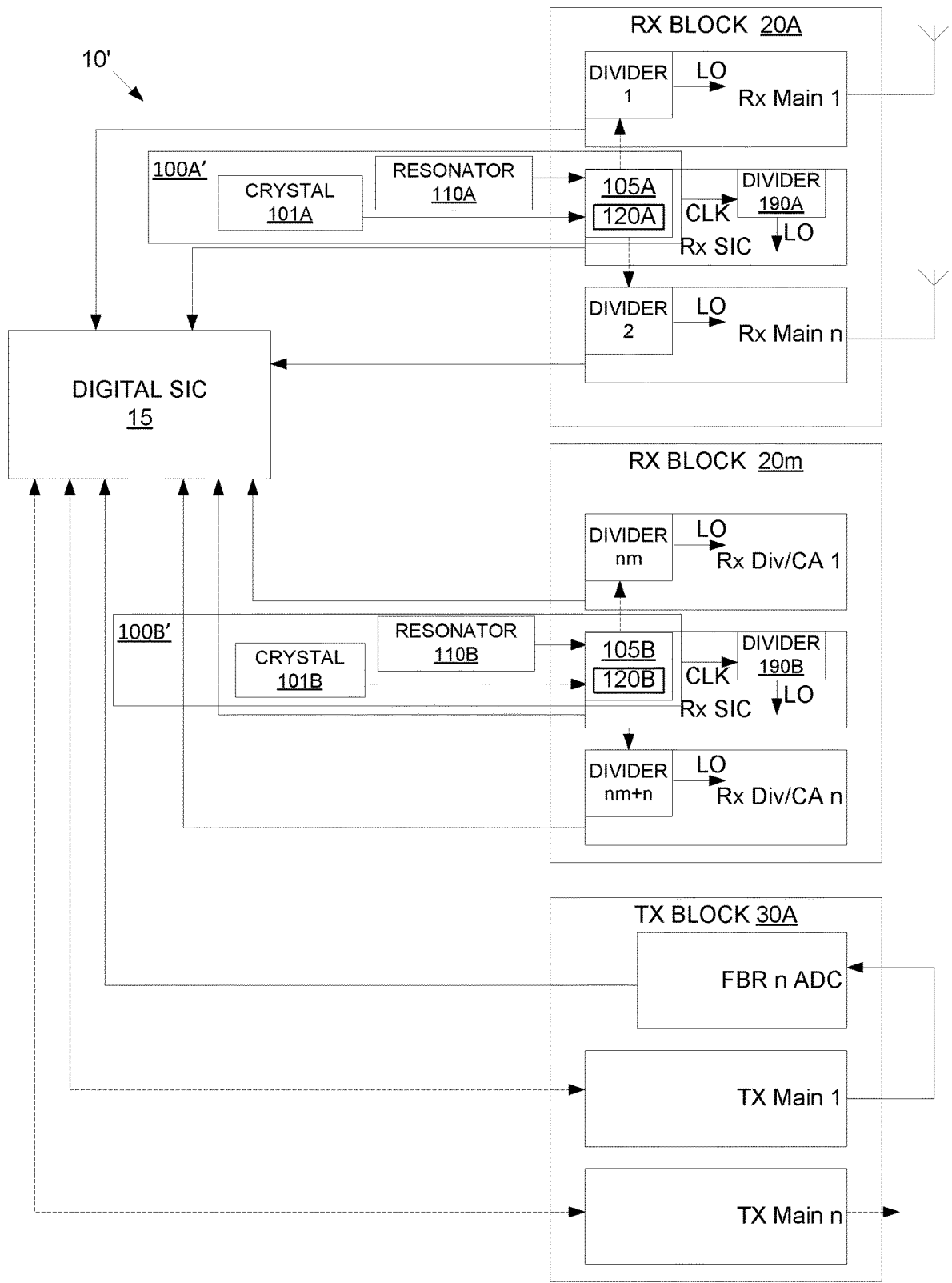
FIG. 1B illustrates an alternative exemplary transceiver that includes an interference cancellation system with resonator-based LO signal generation for receiving interfering signals in accordance with various aspects described.

FIG. 1B illustrates an exemplary transceiver system 10' in which a resonator-based LO signal generation system 100A' and 100B' each include a phase locked loop 105A, 105B, respectively. For the purposes of this description, system 100A' will be described, it is noted that system 100B' includes analogous components and functions in a similar manner. The phase locked loop 105A synchronizes the phase of the clock signal produced by the digital-to-time converter (DTC) 120A with a reference signal produced by a crystal oscillator 101. In this manner, the DTC 120A (or 120B) is operated in a closed loop mode. While in the system of FIG. 1A the output of the DTC 120A or 120B is the LO signal for the SIC receiver chain, in the system 100A' or 100B' of FIG. 1B the output of the DTC 120A or 120B, respectively, is not the LO signal for the SIC receiver chain. Rather, the synchronized clock signal output by the DTC 120A (or 120B) is provided to a divider circuitry 190A (or 190B) that is configured to generate the local oscillator signal based on the synchronized clock signal and a control value that controls the tuned frequency. The synchronized clock signal is also provided to other receivers in the receiver block. While only a single resonator is shown per receiver block, multiple resonators may be used per block and/or resonators may be shared between blocks.

Figure 2:
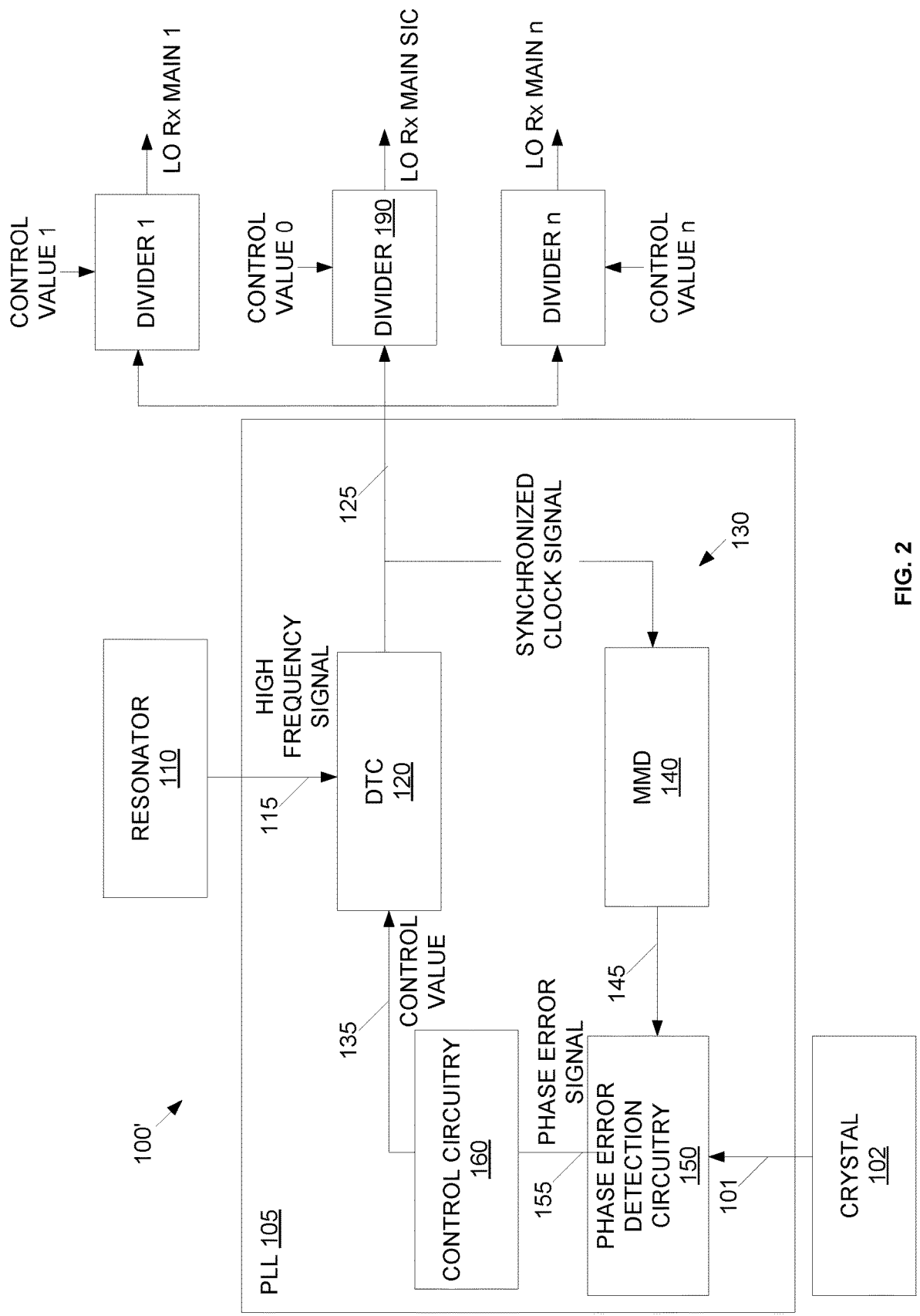
FIG. 2 illustrates an exemplary resonator-based LO signal generation system in accordance with various aspects described.
Figure 3:
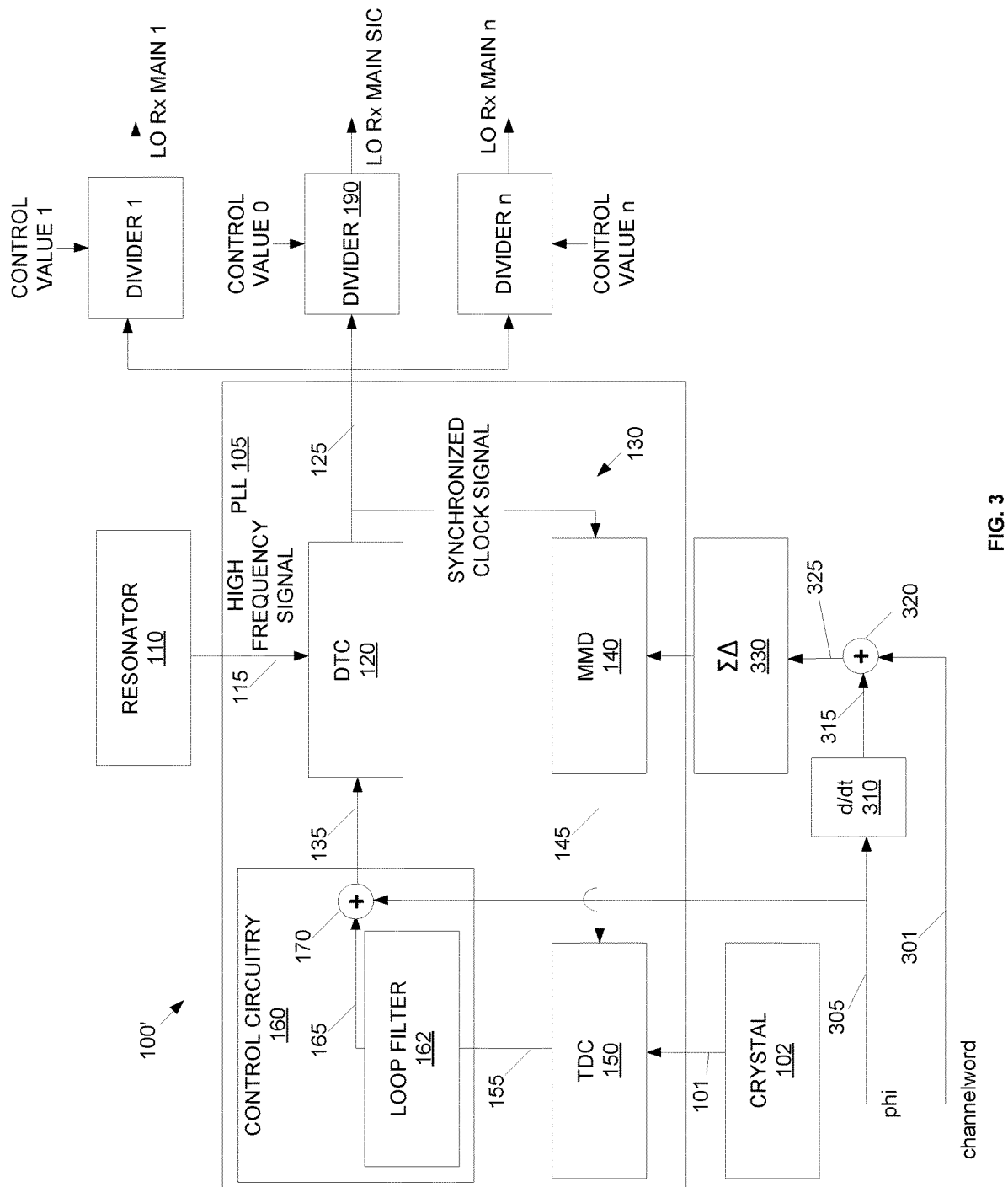
FIG. 3 illustrates an exemplary resonator-based LO signal generation system in accordance with various aspects described.

The LO signal generation systems 100A' and 100B' of FIG. 1B provide the benefit of a clock signal that is synchronized with a reference signal that is used to time other circuitry in the receiver block. Depending on the characteristics, such as due to temperature or aging, of the resonator as compared to the component providing the reference signal (e.g., crystal), it may be advantageous to include a feedback loop that includes the DTC 120A or 120B to maintain the clock signal from the resonator in phase with the reference signal. FIGS. 2 and 3 illustrate an example LO signal generation system that synchronizes the clock signal output by the DTC.

FIG. 2 shows a block diagram of an example implementation of the resonator-based LO signal generation system 100' shown in FIG. 1A. The LO signal generation system 100' includes a PLL 105 with a feedback loop 130 comprising a multi-modulus divider (MMD) 140 (or other suitable divider circuitry), a phase error detection circuitry 150, and a control circuitry 160. The MMD 140 is configured to provide a frequency-divided signal 145 using the synchronized signal 125. The phase error detection circuitry 150 is configured to determine a phase error signal 155 based on a reference signal 101 from a crystal oscillator 102 and the frequency-divided signal 145. Furthermore, the control circuitry 160 is configured to provide the control value 135 for controlling the variable phase adjuster 120 using the determined phase error signal 155.

FIG. 3 shows a block diagram of an example resonator-based LO signal generation system 100' comprising the resonator 110 and the digitally controlled DTC 120. Referring to FIG. 3, the feedback loop 130 may further include a loop filter 162 and a combiner 170. The loop filter 162 is configured to filter the phase error signal 155 to obtain a filtered phase error signal 165. The combiner 170 is configured to combine the filtered phase error signal 165 and a phase modulation signal 305 to obtain a combined signal 135. Here, the combined signal 135 represents a modulation overlapped with the filtered phase error signal 165 for controlling the DTC 120. Furthermore, the combined signal 135 at the output of the combiner 170 shown in FIG. 3 may describe the control value 135 provided by the feedback loop 130 shown in FIG. 2. In FIG. 3, the phase modulation signal 305 received by the combiner 170 is indicated by "phi". Furthermore, the combiner 170 of the feedback loop 130 may represent a first injection point of a two-point modulation scheme.

Further referring to FIG. 3, the resonator-based LO signal generation system 100' may further include a modulator 330, a differentiator 310 and a further combiner 320. The modulator 330 is configured to control the MMD 140 to modulate a frequency division characteristic of the MMD 140 based on a modulator input signal 325. The differentiator 310 is configured to differentiate a phase modulation signal 305 to obtain a frequency modulation signal 315. The further combiner 320 is configured to combine the frequency modulation signal 315 and a frequency channel word 301 to obtain the modulator input signal 325. Here, the frequency channel word 301 may indicate a desired channel frequency of the synchronized clock signal 125. In FIG. 3, the MMD 140 of the feedback loop 130, which is controlled by the modulator 330, may represent a second injection point of the two-point modulation scheme.

Therefore, the resonator-based LO signal generation system 100' of FIG. 3 may substantially be based on a two-point modulation scheme. By the use of this two-point modulation scheme, it is possible to obtain a flexible implementation of the circuit.

In the resonator-based LO signal generation system 100' of FIG. 3, the resonator 110 is configured to generate a high frequency signal 115 for clocking of the DTC 120.

According to FIG. 3, the phase error detection circuitry 150 of the resonator-based LO signal generation system 100' may include a time-to-digital converter (TDC). For example, the time-to-digital converter (TDC) is configured to compare the reference signal 101 and the frequency-divided signal 145 and provide the phase error signal 155 in a digital form based on the comparison. For example, the TDC may be configured to measure a phase difference between the reference signal 101 provided by the crystal oscillator 102 and the frequency-divided signal 145 provided by the divider 140.

Furthermore, the feedback loop 130 of the circuit shown in FIG. 3 may be configured to provide the control value 135 as a digital control value. The DTC 120 is configured to delay the high frequency signal 115 of the resonator 110 by a variable time delay based on the digital control value 135 to obtain the synchronized signal 125.

Referring to FIG. 3, the MMD 140 represents an adjustable divider, such as a multi-modulus divider ("MMD"), while the modulator 330 may, for example, be a sigma-delta modulator ("ΣΔ").

For example, the resonator 110 of the resonator-based LO signal generation system 100' may be configured to generate an unmodulated high frequency carrier signal 115 for the DTC 120.

In other words, the resonator-based LO signal generation system 100' includes a resonator 110, a digitally controlled DTC 120 and a feedback loop 130. The resonator 110 is configured to provide an RF signal 115. The digitally controlled phase DTC 120 is configured to delay the high frequency signal 115 of the resonator 110 by a variable time delay based on a digital control value 135 to obtain a synchronized signal 125. The feedback loop 130 comprises a divider 140, a time-to-digital converter 150 (TDC) and a loop filter 160. The MMD 140 is configured to provide a frequency-divided signal 145 using the synchronized signal 125. The time-to-digital converter 150 (TDC) is configured to compare the reference oscillator signal 101 and the frequency-divided signal 145 and to provide a phase error signal 155 in a digital form based on the comparison. The loop filter 162 is configured to filter the phase error signal 155 to obtain a filtered phase error signal 165. The feedback loop 130 is configured to provide the digital control value 135 for the digitally controlled DTC 120 using the filtered phase error signal 165.

In summary, FIG. 3 shows a feedback loop 130 (or phase locked loop, PLL) based modulator structure. This structure of FIG. 3 is characterized in that the resonator 110 is placed outside the loop 130. In this structure, the resonator 110 generates the unmodulated high frequency signal 115. For example, the DTC 120 shifts the phase of the high frequency signal 115 depending on the digital input (e.g. a digital control value 135) which is a sum of the loop filter output 165 and the phase modulation signal 305.

By using this structure, it is possible that the noise and phase drift introduced by the resonator 110 is attenuated by the feedback loop 130 or PLL. Since the entry point of the noise into the feedback loop or PLL is exactly the same as it would be with the resonator 110 inside the loop (as known from conventional PLLs), the noise attenuation of the feedback loop or PLL is also a highpass function.

In order to limit the frequency error the DTC 120 has to compensate for, the resonator 110 may be set close to the target frequency (e.g. fset~ftarget) before the operation of the feedback loop 130 or PLL starts. Once the feedback loop 130 or PLL is operating, this coarse tuning does not have to be updated. Therefore, it has been found that this tuning can be performed with static control bits. It has also been found that linearity of this tuning is substantially no issue, which makes a circuit implementation rather easy.

For a wideband phase modulation, the two-point modulation scheme (described exemplarily with reference to FIG. 3) can be used.

The DTC input 135 is typically provided in the phase domain, so that the phase signal 305 can be added directly to the loop filter output 165. For the second input at the multi-modulus divider 140, a differentiation (at block 310) may be performed first to transform from the phase domain to the frequency domain. Since the gain and the delay of the DTC 120 as well as the gain of the multi-modulus MMD 140 are usually defined very well, the matching of the two modulation paths (corresponding to the first and the second injection points of the two-point modulation scheme) can be achieved easier than with a conventional PLL structure.

An advantage of the resonator-based LO signal generation system 100 and 100' is that the resonator 110 provides a stable high frequency signal without the need of any tuning.

Basically, the structure of FIG. 3 is realized by using a feedback loop 130 (or phase locked loop) with the resonator 110 being placed outside the loop 130. The DTC 120 may delay the resonator's high frequency signal by a programmable value of time. The DTC output phase 125 may be divided by the multi-modulus divider 140, measured by the TDC 150 and fed back to the DTC input 135 through the loop filter 160.

Furthermore, a phase modulator based on this feedback loop or PLL can be built by adding the phase modulation signal 305 to the loop filter output 165 and additionally, after differentiation (e.g. at block 310), to the frequency channel word 301 which is fed to a sigma-delta modulator 330 controlling a multi-modulus divider 140.

Figure 4:
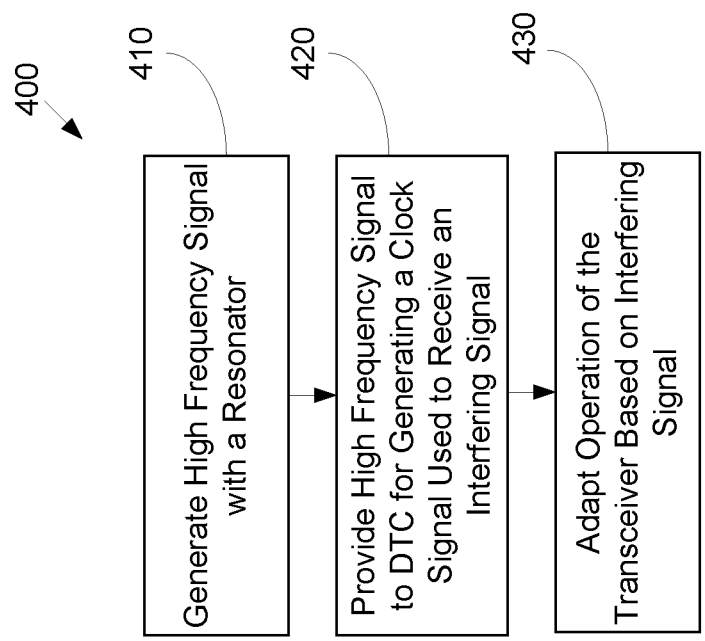
FIG. 4 illustrates a flow diagram outlining an exemplary method configured to cancel interference in a transceiver in accordance with various aspects described.

FIG. 4 illustrates a flow diagram outlining an exemplary method 400 configured to cancel interference in a transceiver. The method 400 may be performed, for example, by the transceivers 10 and/or 10' described in FIGS. 1-3. The method includes, at 410, generating a high-frequency signal having a high frequency with a resonator. At 420, the method includes providing the high-frequency signal and a control word to a digital-to time converter to cause the digital-to-time converter to generate a clock signal for use in receiving an interfering signal having an interference frequency. At 430 operation of the transceiver is adapted based, at least in part, on the received interfering signal. In one example, operation of the transceiver is adapted by generating a replica of the received interfering signal and combining the replica with future received signals.

It can be seen from the foregoing description that the resonator-based LO signal generation systems, methods, and circuitries are capable of monitoring in extended frequency ranges with a digital-to-time converter and not by PLL using inductor. The input clock for resonator-based LO generation for mixed signal SIC can be supplied from a fixed resonator such as a bulk acoustic wave resonator, a micro-electromechanical system resonator, a surface acoustic wave resonator, or a film bulk acoustic resonator, or other high quality resonator.

Figure 5:
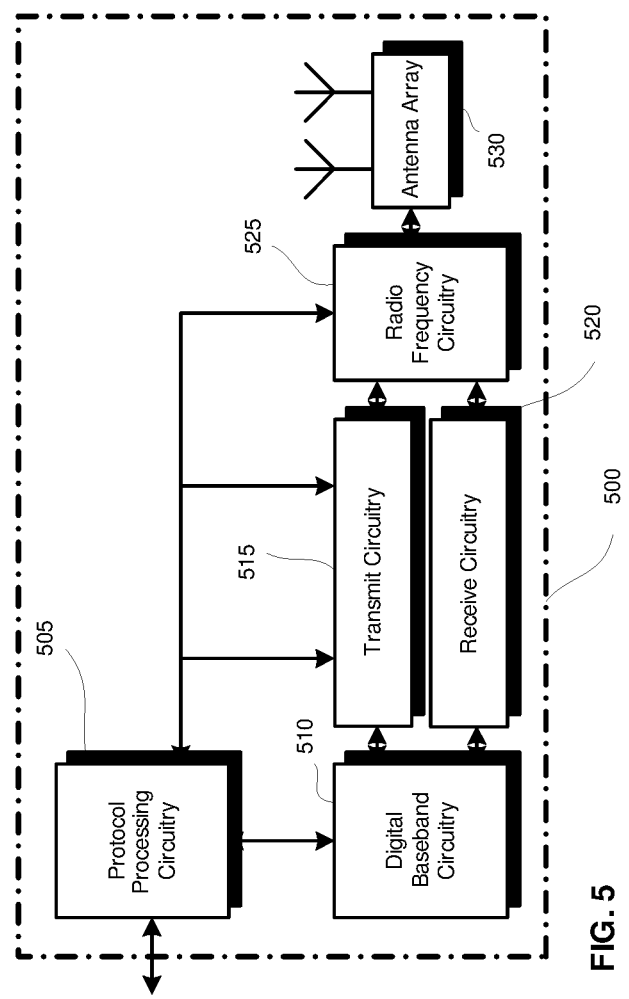
FIG. 5 illustrates an exemplary communication circuitry in accordance with various aspects described.

FIG. 5 illustrates an exemplary communication circuitry 500 according to some aspects. Circuitry 500 is alternatively grouped according to functions. Components as shown in 500 are shown here for illustrative purposes and may include other components not shown here in FIG. 5.

Communication circuitry 500 may include protocol processing circuitry 505, which may implement one or more of medium access control (MAC), radio link control (RLC), packet data convergence protocol (PDCP), radio resource control (RRC) and non-access stratum (NAS) functions. Protocol processing circuitry 505 may include one or more processing cores (not shown) to execute instructions and one or more memory structures (not shown) to store program and data information.

Communication circuitry 500 may further include digital baseband circuitry 510, which may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Communication circuitry 500 may further include transmit circuitry 515, receive circuitry 520 and/or antenna array circuitry 530.

Communication circuitry 500 may further include radio frequency (RF) circuitry 525. In an aspect of the invention, RF circuitry 525 may include multiple parallel RF chains for one or more of transmit or receive functions, each connected to one or more antennas of the antenna array 530. One or more of these RF chains may receive an LO signal generated by a resonator-based LO signal generation circuitry as described in FIGS. 1-4.

In an aspect of the disclosure, protocol processing circuitry 505 may include one or more instances of control circuitry (not shown) to provide control functions for one or more of digital baseband circuitry 510, transmit circuitry 515, receive circuitry 520, and/or radio frequency circuitry 525.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for generating a LO signal for an interference receiver using a resonator and DTC according to embodiments and examples described herein.

Example 1 is an interference cancellation system for a transceiver, including a resonator configured to generate a high-frequency signal, a local oscillator circuitry, and a digital cancellation circuitry. The local oscillator circuitry includes a digital-to time converter configured to receive the high-frequency signal and in response, generate a clock signal having a clock frequency for receiving an interfering signal having an interference frequency. The digital cancellation circuitry is configured to adapt operation of the transceiver based, at least in part, on the received interfering signal.

Example 2 includes the subject matter of example 1, including or omitting optional elements, wherein the local oscillator circuitry includes a phase locked loop (PLL) configured to synchronize the clock signal generated by the digital-to-time converter with a reference signal and a divider circuitry configured to generate a local oscillator signal for receiving the interfering signal based on the synchronized clock signal generated by the digital-to-time converter.

Example 3 includes the subject matter of example 1, including or omitting optional elements, further including a second divider circuitry configured to receive the clock signal and a control word and, in response, generate a local oscillator signal for receiving a desired signal having a desired signal frequency.

Example 4 includes the subject matter of example 1, including or omitting optional elements, wherein the clock frequency is higher than the interference frequency.

Example 5 includes the subject matter of example 1, including or omitting optional elements, wherein the resonator is independent of a coil.

Example 6 includes the subject matter of example 1, including or omitting optional elements, wherein the resonator includes digital components.

Example 7 includes the subject matter of example 1, including or omitting optional elements, wherein the clock frequency is greater than or equal to about 10 GHz.

Example 8 includes the subject matter of example 1, including or omitting optional elements, wherein the resonator includes one or more transistors having a raised channel from source to drain.

Example 9 includes the subject matter of example 1, including or omitting optional elements, wherein the resonator includes one or more of a bulk acoustic wave resonator, a micro-electro-mechanical system resonator, a surface acoustic wave resonator, or a film bulk acoustic resonator.

Example 10 includes the subject matter of example 1, including or omitting optional elements, wherein the digital-to-time converter is configured to operate in open loop mode.

Example 11 is a method configured to cancel interference in a transceiver, including generating a high-frequency signal with a resonator; providing the high-frequency signal to a digital-to time converter to cause the digital-to-time converter to generate a clock signal having a clock frequency for receiving an interfering signal having an interference frequency; and adapting operation of the transceiver based, at least in part, on the received interfering signal.

Example 12 includes the subject matter of example 11, including or omitting optional elements, further including synchronizing the clock signal generated by the digital-to-time converter with a reference signal and providing the synchronized clock signal to a divider circuitry for generating a local oscillator signal.

Example 13 includes the subject matter of example 11, including or omitting optional elements, further including providing the clock signal and a control word to a second divider circuitry and with the second divider circuitry, generating a local oscillator signal for receiving a desired signal having a desired signal frequency.

Example 14 includes the subject matter of example 11, including or omitting optional elements, wherein the clock frequency is higher than the interference frequency.

Example 15 includes the subject matter of example 11, including or omitting optional elements, wherein the resonator includes one or more transistors having a raised channel from source to drain.

Example 16 includes the subject matter of example 11, including or omitting optional elements, wherein the resonator includes one or more of a bulk acoustic wave resonator, a micro-electro-mechanical system resonator, a surface acoustic wave resonator, or a film bulk acoustic resonator.

Example 17 is an interference cancellation system for a transceiver, including a resonator configured to generate a high-frequency signal, local oscillator circuitry, and digital cancellation circuitry. The local oscillator circuitry is configured to generate a local oscillator signal for receiving an interfering signal having an interference frequency. The local oscillator circuitry includes a digital-to time converter configured to receive the high-frequency signal and generate a clock signal having a clock frequency; a phase locked loop (PLL) configured to synchronize the clock signal generated by the digital-to-time converter with a reference signal; and a divider circuitry configured to generate the local oscillator signal based on the synchronized clock signal. The digital cancellation circuitry is configured to adapt operation of the transceiver based, at least in part, on the received interfering signal.

Example 18 includes the subject matter of example 17, including or omitting optional elements, wherein the clock frequency is higher than the interference frequency.

Example 19 includes the subject matter of example 17, including or omitting optional elements, wherein the resonator is independent of a coil.

Example 20 includes the subject matter of example 17, including or omitting optional elements, wherein the resonator includes digital components.

Example 21 includes the subject matter of example 17, including or omitting optional elements, wherein the clock frequency is greater than or equal to about 10 GHz.

Example 22 includes the subject matter of example 17, including or omitting optional elements, wherein the resonator includes one or more transistors having a raised channel from source to drain.

Example 23 includes the subject matter of example 17, including or omitting optional elements, wherein the resonator includes one or more of a bulk acoustic wave resonator, a micro-electro-mechanical system resonator, a surface acoustic wave resonator, or a film bulk acoustic resonator.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. The various illustrative logics, logical blocks, modules, and circuits described in connection with aspects disclosed herein can be implemented or performed with a general purpose processor executing instructions stored in computer readable medium.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application. The use of the phrase "one or more of A, B, or C" is intended to include all combinations of A, B, and C, for example A, A and B, A and B and C, B, and so on.

What is claimed is:

1. An interference cancellation system for a transceiver comprising a receiver block including a plurality of receive chains including a first receive chain for receiving a signal and a second receive chain for interference cancellation, comprising:
   a resonator configured to generate a high-frequency signal;
   a local oscillator circuitry, comprising:
      a digital-to time converter configured to:
         receive the high-frequency signal; and
         in response, generate a clock signal having a clock frequency for receiving an interfering signal having an interference frequency, wherein the interfering signal is obtained in an analog domain by the second receive chain using the clock signal; and
   a digital cancellation circuitry configured to cancel the interfering signal from the received signal in a digital domain.
2. The interference cancellation system of claim 1, wherein the local oscillator circuitry comprises:
   a phase locked loop (PLL) configured to synchronize the clock signal generated by the digital-to-time converter with a reference signal; and
   a divider circuitry configured to generate a local oscillator signal for receiving the interfering signal based on the synchronized clock signal generated by the digital-to-time converter.
3. The interference cancellation system of claim 1, further comprising a second divider circuitry configured to:
   receive the clock signal and a control word; and,
   in response, generate a local oscillator signal for receiving a desired signal having a desired signal frequency.
4. The interference cancellation system of claim 1, wherein the clock frequency is higher than the interference frequency.
5. The interference cancellation system of claim 1, wherein the resonator is independent of a coil.
6. The interference cancellation system of claim 1, wherein the resonator comprises digital components.
7. The interference cancellation system of claim 1, wherein the clock frequency is greater than or equal to about 10 GHz.
8. The interference cancellation system of claim 1, wherein the resonator comprises one or more transistors having a raised channel from source to drain.
9. The interference cancellation system of claim 1, wherein the resonator comprises one or more of a bulk acoustic wave resonator, a micro-electro-mechanical system resonator, a surface acoustic wave resonator, or a film bulk acoustic resonator.
10. The interference cancellation system of claim 1, wherein the digital-to-time converter is configured to operate in open loop mode.
11. A method configured to cancel interference in a transceiver comprising a receiver block including a plurality of receive chains including a first receive chain for receiving a signal and a second receive chain for interference cancellation, comprising:
   generating a high-frequency signal with a resonator;
   providing the high-frequency signal to a digital-to time converter to cause the digital-to-time converter to generate a clock signal having a clock frequency;
   obtaining an interfering signal having an interference frequency in an analog domain by the second receive chain using the clock signal; and
   cancelling the interfering signal from the received signal by the first receive chain in a digital domain.
12. The method of claim 11, further comprising:
   synchronizing the clock signal generated by the digital-to-time converter with a reference signal; and
   providing the synchronized clock signal to a divider circuitry for generating a local oscillator signal.
13. The method of claim 11, further comprising:
   providing the clock signal and a control word to a second divider circuitry; and
   with the second divider circuitry, generating a local oscillator signal for receiving a desired signal having a desired signal frequency.
14. The method of claim 11, wherein the clock frequency is higher than the interference frequency.
15. The method of claim 11, wherein the resonator comprises one or more transistors having a raised channel from source to drain.
16. The method of claim 11, wherein the resonator comprises one or more of a bulk acoustic wave resonator, a micro-electro-mechanical system resonator, a surface acoustic wave resonator, or a film bulk acoustic resonator.

17. An interference cancellation system for a transceiver comprising a receiver block including a plurality of receive chains including a first receive chain for receiving a signal and a second receive chain for interference cancellation, comprising:
- a resonator configured to generate a high-frequency signal;
- a local oscillator circuitry configured to generate a local oscillator signal for receiving an interfering signal having an interference frequency, wherein the interfering signal is obtained in an analog domain by the second receive chain using the clock signal, the local oscillator circuitry comprising:
  - a digital-to time converter configured to receive the high-frequency signal and generate a clock signal having a clock frequency;
  - a phase locked loop (PLL) configured to synchronize the clock signal generated by the digital-to-time converter with a reference signal; and
  - a divider circuitry configured to generate the local oscillator signal based on the synchronized clock signal; and
- digital cancellation circuitry configured to cancel the interfering signal from the received signal in a digital domain.

18. The interference cancellation system of claim 17, wherein the clock frequency is higher than the interference frequency.

19. The interference cancellation system of claim 17, wherein the resonator is independent of a coil.

20. The interference cancellation system of claim 17, wherein the resonator comprises digital components.

21. The interference cancellation system of claim 17, wherein the clock frequency is greater than or equal to about 10 GHz.

22. The interference cancellation system of claim 17, wherein the resonator comprises one or more transistors having a raised channel from source to drain.

23. The interference cancellation system of claim 17, wherein the resonator comprises one or more of a bulk acoustic wave resonator, a micro-electro-mechanical system resonator, a surface acoustic wave resonator, or a film bulk acoustic resonator.

* * * * *